US011131719B2

(12) United States Patent
Armschat et al.

(10) Patent No.: US 11,131,719 B2
(45) Date of Patent: Sep. 28, 2021

(54) METHOD AND DEVICE FOR IDENTIFYING AN INTER-TURN SHORT CIRCUIT IN PARALLEL WINDINGS

(71) Applicant: SIEMENS ENERGY GLOBAL GMBH & CO. KG, Munich (DE)

(72) Inventors: Christoph Armschat, Erlangen (DE); Klaus Pointner, Linz (DE)

(73) Assignee: Siemens Energy Global GmbH & Co. KG, Munich (DE)

(*) Notice: Subject to any disclaimer, the term of this patent is extended or adjusted under 35 U.S.C. 154(b) by 0 days.

(21) Appl. No.: 17/056,089

(22) PCT Filed: May 17, 2018

(86) PCT No.: PCT/EP2018/062902
§ 371 (c)(1),
(2) Date: Nov. 17, 2020

(87) PCT Pub. No.: WO2019/219196
PCT Pub. Date: Nov. 21, 2019

(65) Prior Publication Data
US 2021/0208207 A1    Jul. 8, 2021

(51) Int. Cl.
*G01R 31/52* (2020.01)
*G01R 31/62* (2020.01)
*G01R 31/72* (2020.01)

(52) U.S. Cl.
CPC ............ *G01R 31/52* (2020.01); *G01R 31/62* (2020.01); *G01R 31/72* (2020.01)

(58) Field of Classification Search
USPC .............................................. 324/546, 547
See application file for complete search history.

(56) References Cited

U.S. PATENT DOCUMENTS

| | | | |
|---|---|---|---|
| 7,253,634 B1* | 8/2007 | Kasztenny | H02H 1/0092 |
| | | | 324/509 |
| 11,009,557 B2 | 5/2021 | Schaper et al. | |
| 2003/0098626 A1* | 5/2003 | Ehrhart | H02H 3/023 |
| | | | 310/156.01 |
| 2011/0266986 A1* | 11/2011 | Christmann | H02P 29/0241 |
| | | | 318/400.21 |
| 2014/0159621 A1* | 6/2014 | Gu | H02P 29/032 |
| | | | 318/400.02 |
| 2017/0227594 A1 | 8/2017 | Zhang et al. | |
| 2018/0131302 A1* | 5/2018 | Frampton | H02P 9/14 |

FOREIGN PATENT DOCUMENTS

| | | |
|---|---|---|
| CN | 102694371 A | 9/2012 |
| JP | S521846 A | 2/1977 |
| JP | S58211671 A | 12/1983 |
| JP | 2006184241 A | 7/2006 |
| WO | 2017121846 A1 | 7/2017 |

\* cited by examiner

*Primary Examiner* — Tung X Nguyen
*Assistant Examiner* — Robert P Alejnikov, Jr.
(74) *Attorney, Agent, or Firm* — Laurence A. Greenberg; Werner H. Stemer; Ralph A. Locher

(57) ABSTRACT

A method monitors an electrical assembly which contains a plurality of electrical coils connected in parallel. In the method, the difference in current between the current flowing through the coils and the mean value of the currents flowing through the coils is ascertained for each of the coils connected in parallel. The differences in current are used to identify when an inter-turn short circuit occurs in one of the coils.

21 Claims, 1 Drawing Sheet

METHOD AND DEVICE FOR IDENTIFYING AN INTER-TURN SHORT CIRCUIT IN PARALLEL WINDINGS

BACKGROUND OF THE INVENTION

Field of the Invention

The invention relates to a method for monitoring an electrical arrangement that comprises a plurality of coils arranged electrically in parallel. The invention further relates to such an arrangement.

Such coils, connected electrically in parallel, can, for example, be found in transformers or in electrical chokes (for example in an air-cored choke or in an oil-insulated or gas-insulated choke). An inter-turn short-circuit (short-circuit between windings) can occur in such a coil in rare cases. In order that the thermal energy input into the winding that has been shorted by the inter-turn short-circuit does not become too great, it is desirable to detect such an inter-turn short-circuit quickly. The arrangement can thereupon, for example, be switched off quickly. Otherwise, if the thermal energy input is too great, a fire can start.

As a result of an inter-turn short-circuit of a single winding of a coil, the total inductance of the arrangement however only changes to a very small extent. This change in the inductance can, for example, amount to only one percent, or only a fraction of one percent of the total inductance, and is therefore scarcely detectable in the field with usual measuring technology. In order to counter the associated fire risk, it is possible to erect such electrical arrangements with coils spatially distanced from other valuable devices (from converters, for example). Additional space is, however, thereby required, as well, possibly, as the additional expense of walls and wall bushings. Nevertheless, even with such a spatially distanced erection of the arrangement, there is a high delay before an inter-turn short-circuit is detected in an indirect manner. A detection of the inter-turn short-circuit is in that case not possible until smoldering has started in the insulation of the affected coil and an alarm is triggered by means of fire gas detection, infrared cameras or similar conventional fire detection techniques.

SUMMARY OF THE INVENTION

The invention is based on the object of providing a method and an arrangement with which an inter-turn short-circuit of a single winding can be safely and reliably detected.

This object is achieved according to the invention by a method and an arrangement according to the independent patent claims. Advantageous forms of embodiment of the method and of the arrangement are given in the dependent patent claims.

A method is disclosed for monitoring an electrical arrangement that comprises a plurality of coils arranged electrically in parallel, wherein, in the method
 for each of the coils of the parallel circuit, the current difference between the current flowing through this coil and the mean value of the currents flowing through the coils is ascertained, and
 the occurrence of an inter-turn short-circuit in one of the coils is recognized on the basis of the current differences.

It is particularly advantageous here that in each case the current difference between the current flowing through the coil and the mean value of the currents flowing through the coils is ascertained. Even under the tough conditions of industrial operation, an inter-turn short-circuit can be detected safely and reliably by means of these current differences.

The method can proceed in such a way that
 a mean value of the current differences of the coils is ascertained,
 the ratio of the current difference to the mean value of the current differences is formed for each of the coils,
 the temporal change of the ratio is monitored, and
 the occurrence of the inter-turn short-circuit in the respective coil is recognized when the temporal change exceeds a predetermined threshold value.

It is particularly advantageous here that the ratio of the current difference and the mean value of the current differences is formed for each of the coils. This ratio changes significantly when an inter-turn short-circuit occurs, and can thereby be relatively easily and reliably monitored.

The method can also proceed in such a way that a (common) monitoring unit is assigned to the coils of the parallel circuit to which signals that describe the currents flowing through the coils, or signals (difference signals) describing the current differences are transmitted, and by which the signals are evaluated, whereby the occurrence of the inter-turn short-circuit in the respective coil is recognized. All the coils of the parallel circuit can advantageously be monitored with this monitoring unit. The signals that describe the coil currents can also be referred to as current signals, and the signals describing the current differences can also be referred to as signals representing the current differences.

The method can also proceed in such a way that upon recognition of the occurrence of an inter-turn short-circuit in one of the coils by the monitoring unit, a monitoring signal is transmitted to a monitoring receiver. In response to the monitoring signal, the electrical arrangement can then, for example, be switched off.

The method can proceed in such a way that the monitoring signal is transmitted to the monitoring receiver by the monitoring unit by means of a wireless signal, in particular by means of a radio signal, and/or by means of an optical fiber. Through this way of transmitting the monitoring signal, an electrical insulation between the monitoring unit and the monitoring receiver is advantageously realized.

The method can also proceed in such a way that the arrangement comprises a first terminal and a second terminal, wherein, when the arrangement is operating, the second terminal has at certain times (in particular transiently) a greater electrical potential than the first terminal, and wherein the monitoring unit is operated at essentially the electrical potential of the second terminal. This has the advantage that no electrical potential insulation between current measuring units (in particular current transformers) and the monitoring unit is necessary (if the current measuring units are also arranged at this second terminal). An optional temperature monitoring close to the hotspot of the windings, which is advantageously arranged in the upper region of the coil(s) close to the hotspot of the winding, then in particular operates at the same electrical potential, so that the temperature measurement can also be carried out by the same monitoring unit.

The method can also proceed in such a way that the monitoring receiver is operated at essentially ground potential. The monitoring receiver that is arranged at essentially ground potential can be realized comparatively easily, since no particular insulation requirements have to be taken into consideration here. This applies in particular to electrical arrangements that are arranged at a high voltage potential (or medium voltage potential).

The method can also proceed in such a way that the arrangement comprises at least two, in particular at least three coils arranged in a parallel circuit. Such arrangements with at least two, in particular at least three, coils arranged in a parallel circuit occur in particular in air-cored coils. Such air-cored coils can, for example, also comprise 20 or more coils (layers). Such air-cored coils are often employed at energy transmission plants, for example for reactive power compensation or in high-voltage direct current transmission plants as converter arm chokes or smoothing chokes in the direct current path.

The method can proceed in such a way that the arrangement is a coil arrangement, in particular an air-cored coil arrangement. Applying the method to oil-insulated coils, in particular to oil-insulated transformers, is however also conceivable.

The method can also proceed in such a way that the current difference between the current flowing through one of the coils and the mean value of the currents flowing through the coils is ascertained in each case by means of a current transformer that is connected in series with the respective coil, wherein the secondary windings of the current transformers are arranged in series and the series circuit forms a closed mesh. A unique current transformer is thus assigned to each coil. This current transformer is arranged in the current path of the respective coil. By means of this current transformer the current difference can advantageously be acquired metrologically, (which means that this current difference does not have to be calculated by a logic circuit or the like). The monitoring unit can thereby be constructed in a relatively simple and therefore economical manner. This is in particular advantageous in the field of high-voltage technology, where the monitoring unit is located at a high voltage potential, and high requirements for measurement accuracy are therefore comparatively complex and expensive.

The method can also proceed in such a way that a resistor (measuring resistor) is connected in parallel with each of the secondary windings, wherein the voltage occurring at the resistor forms a signal (voltage signal) that describes the current difference of the associated coil (from the mean value of the coil currents). This signal can advantageously be supplied to the monitoring unit.

The method can also proceed in such a way that the monitoring unit is supplied with electrical energy that is coupled out from at least one of the currents flowing through the coils. As a result, the monitoring unit is advantageously supplied with electrical energy that is tapped off the arrangement with the coils connected in parallel. Long energy supply lines that lead to the monitoring unit are thereby avoided. This is particularly advantageous in the field of high-voltage technology, where such energy supply lines can lead to insulation problems or to perturbing interference should transient events occur.

The method can also proceed in such a way that the monitoring unit is supplied with electrical energy that is coupled out from at least one of the current transformers. In particular, the electrical energy can be coupled out from all the current transformers. All of the current flowing through the arrangement is then used for the energy supply of the monitoring unit. All of the current transformers are then equally burdened (loaded), and the symmetry, and thereby the measurement result, is not impaired. The current transformers then advantageously have a double function: the current transformers serve for measurement and for the power supply of the monitoring unit (energy harvesting).

An arrangement is further disclosed with
a plurality of coils arranged electrically in parallel,
a measuring device that ascertains, for the coils of the parallel circuit, the current ($I1$, $I2$, $I3$) flowing through these coils or in each case the current difference between the current flowing through this coil and the mean value of the currents flowing through these coils, and
a (common) monitoring unit assigned to the coils of the parallel circuit that receives the signals ($S1$, $S2$, $S3$) that describe the ascertained currents ($I1$, $I2$, $I3$) or the ascertained current differences and recognizes when an inter-turn short-circuit occurs in one of the coils on the basis of the currents or the current differences.

This arrangement can be designed in such a way that
the monitoring unit is designed in such a way that it ascertains a mean value of the current differences of the coils,
for each of the coils the ratio of the current difference to the mean value of the current differences is formed,
the temporal change of the ratio is monitored, and
the occurrence of the inter-turn short-circuit in the respective coil is recognized when the temporal change of the ratio exceeds a predetermined threshold value.

The monitoring of the arrangement is thereby advantageously possible independently of the instantaneous value of the operating current of the coils.

The arrangement can also be designed in such a way that, on recognition of the occurrence of an inter-turn short-circuit in one of the coils, the monitoring unit transmits a monitoring signal to a monitoring receiver.

The arrangement can be designed in such a way that the monitoring unit transmits the monitoring signal to the monitoring receiver by means of a wireless signal, in particular by means of a radio signal, and/or by means of an optical fiber.

The arrangement can also be designed in such a way that the arrangement comprises a first terminal and a second terminal, wherein, when the arrangement is operated, the second terminal has, at least some of the time (in particular transiently), a higher electrical potential than the first terminal, and wherein the monitoring unit is arranged essentially at the electrical potential of the second terminal.

The arrangement can also be designed in such a way that the monitoring receiver is arranged essentially at ground potential.

The arrangement can be designed in such a way that the arrangement comprises at least 2, in particular at least 3, coils arranged electrically in parallel.

The arrangement can also be designed in such a way that the arrangement is a coil arrangement, in particular an air-cored coil arrangement or an arrangement with oil-insulated coils.

The arrangement can be designed in such a way that the measuring device for each coil comprises a current transformer that is connected in series with the respective coil, wherein the secondary windings of the current transformers are arranged in a series circuit, and the series circuit forms a closed mesh.

The arrangement can also be designed in such a way that a measuring resistor is connected in parallel with each of the secondary windings, wherein the voltage occurring at the measuring resistor represents a signal (voltage signal) that describes the current difference of the associated coil.

The arrangement can be designed in such a way that the arrangement comprises an energy supply device that couples the electrical energy for the supply of the monitoring unit out of at least one of the currents flowing through the coils.

The arrangement can also be designed in such a way that the energy supply device couples the electrical energy for the supply of the monitoring unit out of at least one of the current transformers.

The method described and the arrangement described have the same or similar advantages.

The invention is explained in more detail below with reference to exemplary embodiments. The same reference signs here refer to elements that are the same or that have the same effect.

DETAILED DESCRIPTION OF THE INVENTION

Figure 1:
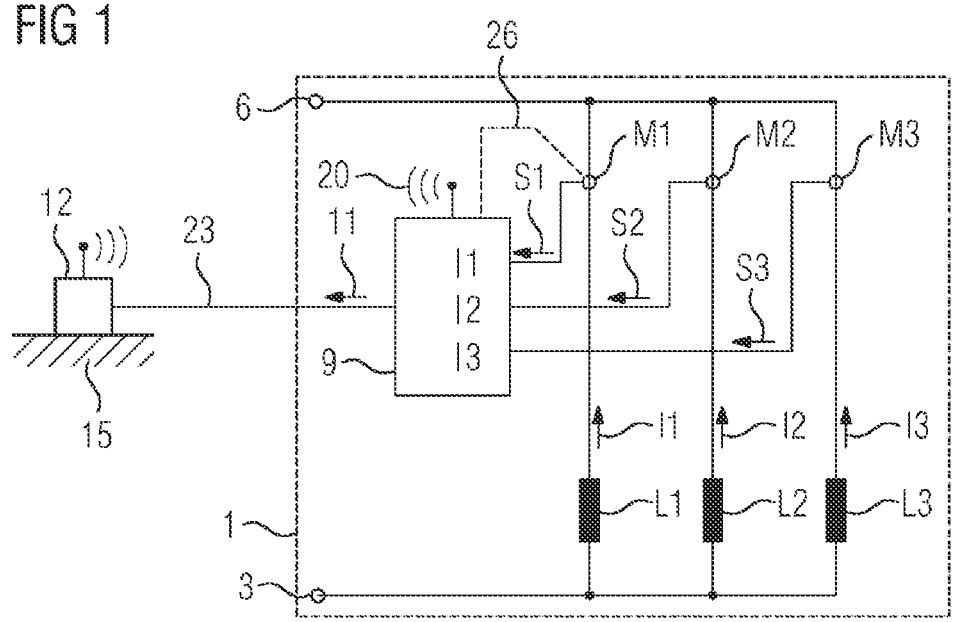
FIG. 1 shows an exemplary embodiment of an arrangement with three coils arranged electrically in parallel and a monitoring unit.

An exemplary arrangement of an electrical arrangement 1 is illustrated in FIG. 1. This electrical arrangement 1 comprises a first electrical coil L1, a second electrical coil L2 and a third electrical coil L3. These three coils L1, L2 and L3 are arranged electrically in parallel. Each of the coils L1, L2 and L3 respectively comprises a first coil terminal and a second coil terminal. The first coil terminals of the three coils are electrically connected to a first terminal 3 of the arrangement 1. The second coil terminals of the three coils are connected electrically to a second terminal 6 of the arrangement 1. Only the first terminal 3 and the second terminal 6 of the arrangement are accessible from outside. As viewed from outside, the arrangement 1 appears like one coil with the first terminal 3 and the second terminal 6.

The coils L1, L2 and L3 can, for example, be designed as concentric coils L1, L2 and L3 with the form of hollow cylinders. The first coil L1 can, for example, form a first (inner) layer of the arrangement, the second coil L2 a second (middle) layer, and the third coil L3 a third (outer) layer. The layers are then concentric layers with the form of hollow cylinders. The arrangement can have the form of a hollow cylinder, while the axis of rotation of the arrangement can be aligned vertically. As a result of this way of erecting the arrangement, the air that is heated in the interior of the hollow-cylindrical arrangement can rise, whereby air cooling results. The first terminal 3 can, for example, be arranged at one of the circular faces (also referred to as the carrier star) of the hollow-cylindrical arrangement, and the second terminal 6 at the other circular face (carrier star) of the arrangement. In particular, the first terminal 3 can be arranged at the lower circular face (i.e. at the bottom edge) of the hollow-cylindrical arrangement, and the second terminal 6 at the upper circular face, i.e. the upper edge) of the arrangement.

When the arrangement is operating, a first current I1 (first coil current I1) flows through the first coil L1. A second current I2 (second coil current I2) flows through the second coil L2, and a third current I3 (third coil current I3) flows through the third coil L3. The sum of the currents I1, I2 and I3 form the total current of the arrangement that flows via the first terminal 3 and the second terminal 6.

A respective current path of the parallel circuit is assigned to each of the coils. A first current sensor M1 is arranged at the current path of the first coil L1. The first current sensor M1 measures the first current I1 flowing through the first coil L1, or a value derived from this current I1. The first current sensor M1 transmits a first signal S1 to a monitoring unit 9. In the same way a second current sensor M2 is arranged at the current path of the second coil L2, and a third current sensor M3 at the current path of the third coil L3. The second current sensor M2 transmits a second signal S2 to the monitoring unit 9; the third current sensor M3 transmits a third signal S3 to the monitoring unit 9. The monitoring unit 9 evaluates the first signal S1, the second signal S2 and the third signal S3, and detects when an inter-turn short-circuit occurs in one of the coils L1, L2 or L3 on the basis of the signals S1, S2 and S3.

Upon recognizing the occurrence of such an inter-turn short-circuit, the monitoring unit 9 transmits a monitoring signal 11 to a monitoring receiver 12. The monitoring signal 11 can be transmitted from the monitoring unit 9 to the monitoring receiver 12 by means of a radio signal 20 and/or by means of an optical fiber 23. The monitoring signal 11 can advantageously be transmitted to the monitoring receiver 12 both by means of the radio signal 20 and by means of the optical fiber 23. A redundant signal transmission advantageously results. Instead of the radio signal, another wireless signal (i.e. another wireless signal transmission technology) can be used.

The monitoring receiver 12 is arranged outside the arrangement 1. The monitoring receiver 12 is arranged essentially at ground potential 15. The arrangement 1 can be arranged at a high electrical potential, for example at a high voltage potential greater than 10 kV.

The first current sensor M1, the second current sensor M2 and the third current sensor M3 form a measuring device that ascertains, for each of the three coils L1, L2, L3 of the parallel circuit, a current difference $\Delta In$ between the current I1, I2 and I3 respectively flowing through these coils and a mean value Iav. The mean value Iav is the mean value of the currents I1, I2 and I3 flowing through the coils L1, L2 and L3. The mean value can also be referred to as the average current Iav flowing through the coils L1, L2 and L3. A particularly advantageous possibility for realizing such a measuring device is illustrated below in connection with FIG. 2. The signals S1, S2 and S3 describe the respective current differences $\Delta I1$, $\Delta I2$ and $\Delta I3$. The monitoring unit 9 evaluates these current differences $\Delta In$ and detects on the basis of the current differences $\Delta In$ when an inter-turn short-circuit occurs in one of the coils L1, L2 or L3.

Alternatively, the measuring device can ascertain only the currents I1, I2 and I3 flowing through the coils with the three current sensors M1, M2 and M3. The signals S1, S2 and S3 then describe the respective currents I1, I2 and I3. The monitoring unit 9 then determines the current differences $\Delta I1$, $\Delta I2$, $\Delta I3$ from the currents I1, I2, I3. An inter-turn short-circuit in one of the coils L1, L2 or L3 is then established by means of evaluating these current differences (12/7) $\Delta In$.

The arrangement 1 is a coil arrangement. The arrangement 1 can, in particular, be an air-cored coil arrangement. In this case, the arrangement comprises coils L1, L2 and L3 without iron cores. The coils L1, L2 and L3 can, however, also be oil-insulated coils, for example oil-insulated coils of a transformer. In another exemplary embodiment, the arrangement 1 can also comprise only two coils (for example the first coil L1 and the second coil L2). Alternatively, the arrangement 1 can also comprise more than three coils. For example, four coils, five coils or even more than five coils can be arranged in the parallel circuit and connected electrically in parallel.

When the arrangement is operating, the second terminal 6 has a greater electrical potential than the first terminal 3. The monitoring unit 9 in the exemplary embodiment is arranged essentially at the electrical potential of the second terminal 6. This electrical potential is at least transiently greater than the ground potential 15. Through the transmission of the signal 11 by means of the wireless transmission technology (for example as a radio signal 20) and/or by means of the optical fiber 23, sufficient electrical insulation is ensured between the monitoring unit 9 and the monitoring receiver 12. The first current sensor M1, the second current sensor M2 and/or the third current sensor M3 can preferably each be designed as a measuring transducer. The first current sensor M1, the second current sensor M2 and/or the third current sensor M3 can, for example, each be designed as a current transformer (for example as a conventional split core current transformer). The transformer ratio of the current transformers M1, M2 and M3 can here be adapted to the respective currents In expected for the individual coils. This has the consequence that approximately equal output values (secondary currents with the same value in particular) occur at each current transformer.

The monitoring unit 9 can optionally be supplied with electrical energy that is coupled out from one of these current transformers M1, M2 or M3, from the totality of the current transformers M1, M2 and M3, or also from a separate current transformer. The energy supply of the monitoring unit 9 can also optionally take place through one of the three current transformers M1, M2 or M3, through all three current transformers, or also through a separate current transformer. When a separate current transformer is used the measuring equipment and the energy supply can advantageously be separated from one another (and employ a dedicated current transformer in each case for the measurement and the energy supply). In this way (in particular in the case of high voltage applications) the monitoring unit can be supplied with electrical energy easily and economically. An energy supply line from ground potential to the monitoring unit 9, which could cause insulation problems, is in particular not necessary. For example, only one (short) energy supply line is required from the respective current transformer to the monitoring unit 9. Such an energy supply line 26 is indicated in FIG. 1 by means of a dashed line; the energy supply line 26 is an energy supply device 26.

The monitoring unit 9 is a common monitoring unit 9 for all the coils L1, L2 and L3 of the parallel circuit. This monitoring unit 9 is advantageously a component of the arrangement. The monitoring unit 9 is mechanically integrated into the arrangement, and can therefore be arranged comparatively close to the current sensors M1, M2 and M3. Problems resulting from interfering signals or induced interfering voltages are thereby avoided.

The monitoring unit 9 can be mounted directly at a carrier arrangement for the coils (in the case of large air-cored chokes this carrier arrangement is also referred to as the carrier star). The monitoring unit 9 can be provided, for example, with a cladding of aluminum sheet for magnetic screening. The eddy currents occurring in this cladding serve to screen the monitoring unit. As a result (and optionally also in combination with a transformer sheet lying inside the cladding) the magnetic field can be limited to an acceptable degree. It is further advantageous to align a circuit board with electronic components of the monitoring unit parallel to the magnetic field lines, i.e. parallel to the coil axis, so that induced currents do not arise in the conductor loops on the circuit board. An arrangement of the current sensors and the monitoring unit in the lower part of the arrangement (for example at the lower carrier star) can be advantageous, since as a rule a lower operating temperature is present there, and the monitoring unit 9 is thereby decoupled from the heating of the choke caused by the current. An arrangement of the monitoring unit at the upper end of the arrangement (carrier star) can alternatively be advantageous if, in addition to the coil currents, the temperature close to the hotspot of the choke is to be measured.

Figure 2:
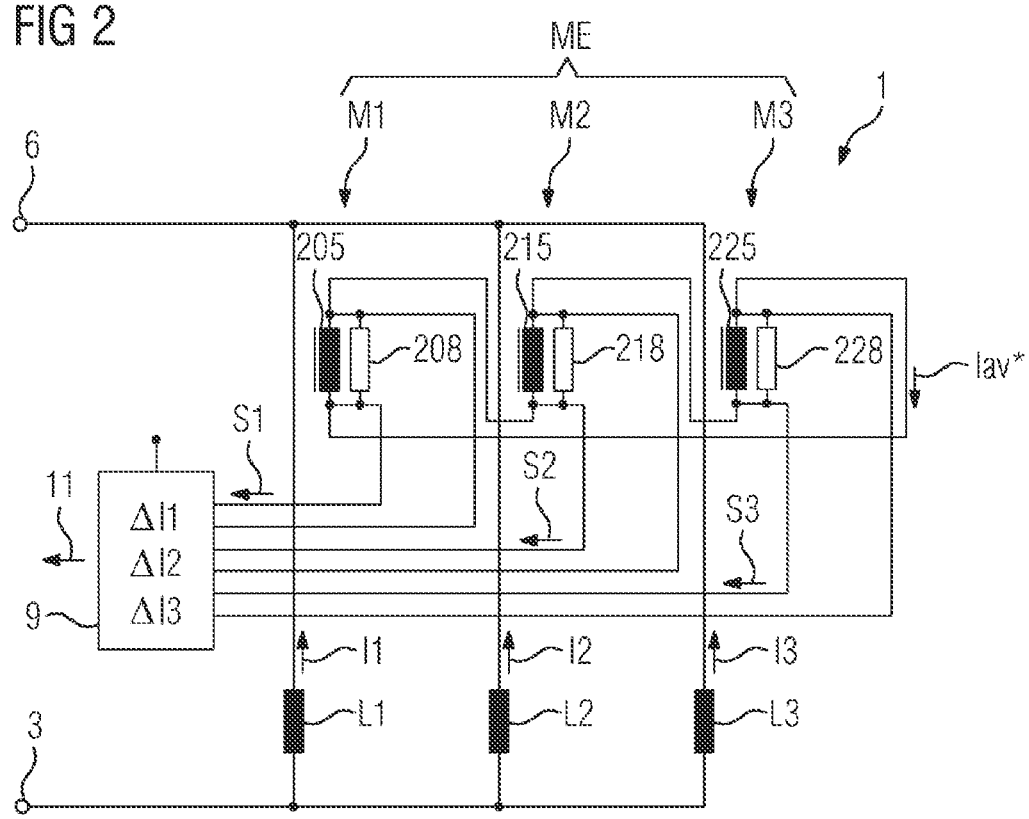
FIG. 2 shows the arrangement with an advantageous exemplary embodiment of a measuring device for the ascertainment of current differences.

An exemplary embodiment of an arrangement 1 that comprises a particularly advantageous measuring device ME for determining the current difference $\Delta In$ between the current I1, I2 or I3 flowing through one of the coils L1, L2 or L3 and the mean value Iav of the currents I1, I2 and I3 flowing through the coils L1, L2 and L3 is illustrated in FIG. 2. The first current sensor M1 here is designed as a current transformer. This current transformer M1 comprises a first secondary winding 205. This first secondary winding 205 is coupled to the electrical conductor via an iron core, symbolized by a vertical line, that carries the first current I1 of the first coil L1. A first ohmic resistor 208 (first measuring resistor 208) is connected in parallel with this first secondary winding 205. The voltage appearing at the first resistor 208 forms the first signal S1 (first voltage signal S1) that describes the current difference $\Delta I1$ (from the mean value of the coil currents) of the associated coil L1. This first signal S1 is transmitted to the monitoring unit 9.

In the same way, the second current sensor M2 and the third current sensor M3 are each designed as a current transformer. The second current transformer M2 here comprises a second secondary winding 215 and a second measuring resistor 218. The third current transformer M3 comprises a third secondary winding 225 and a third measuring resistor 228. The voltage appearing at the second measuring resistor 215 forms the second signal S2; the voltage appearing at the third measuring resistor 225 forms the third measurement signal S3.

The first secondary winding 205 of the first current transformer, the second secondary winding 215 of the second current transformer and the third secondary winding 225 of the third current transformer are here arranged in a series circuit, wherein this series circuit forms a closed mesh. The first secondary winding 205, the second secondary winding 215 and the third secondary winding 225 thus form a closed mesh. A current Iav* that is proportional to the mean value Iav of the currents I1, I2 and I3 flowing through the three coils L1, L2 and L3 flows in this closed mesh. If a current that differs from the mean value Iav flows through one of the coils L1, L2 or L3, then a current proportional to this current difference flows through the measuring resistor of the associated current transformer. A voltage therefore occurs at the measuring resistor that is proportional to the current difference $\Delta In$ between the current In flowing through the respectively assigned coil and the mean value Iav of the currents flowing through the three coils L1, L2 and L3. Here, $\Delta I1=I1-Iav$, $\Delta I2=I2-Iav$ and $\Delta I3=I3-Iav$. The first signal S1 is thus proportional to the current difference $\Delta I1$ between the current I1 flowing through the first coil L1 and the mean value Iav. The first signal S1 thus describes the current difference $\Delta I1$ of the first coil L1. The same applies analogously to the second signal S2 and the third signal S3.

The mean value Iav of the currents flowing through the coils (i.e. for the current Iav flowing on average through the coils) is given by:

$$Iav = \frac{1}{x}\sum_{n=1}^{x} In$$

wherein x is the number of coils in the parallel circuit. Here $$Iav = \frac{I1 + I2 + I3}{3}$$

applies.

The current differences ΔIn are thus advantageously ascertained in that the secondary windings of the current transformers are arranged in a closed mesh, so that the same current Iav flows through all the secondary windings. As a result, the current differences ΔIn can be ascertained particularly easily (in an analogous manner). This is possible with simple measuring technology having comparatively low requirements for precision. The need to ascertain the current differences ΔIn through computational methods in the monitoring unit 9 is thereby avoided. Such an ascertainment of the current differences ΔIn through calculation/computation would cause a greater complexity in the monitoring unit 9 and in some circumstances require more accurate measuring technology. This way of ascertaining the current differences ΔIn is, of course, also possible (i.e. for example by means of a measurement of the currents I1, I2 and I3 flowing through each of the coils L1, L2 and L3 and a subsequent calculation of the current differences ΔIn).

The monitoring unit 9 receives the first signal S1, the second signal S2 and the third signal S3. Information regarding the current differences ΔI1, ΔI2 and ΔI3 of the coils L1, L2 and L3 is thus present at the monitoring unit 9. These current differences ΔIn are now evaluated in the monitoring unit 9 as follows.

A mean value ΔIav of these current differences ΔI1, ΔI2 and ΔI3 is first determined:

$$\Delta Iav = \frac{1}{x}\sum_{n=1}^{x} \Delta In$$

wherein x is the number of coils of the parallel circuit. In the exemplary embodiment $$\Delta Iav = \frac{\Delta I1 + \Delta I2 + \Delta I3}{3}$$

applies.

The mean value ΔIav thus represents an averaged current difference ΔIav. For each coil, the ratio of the respective current difference ΔIn and the mean value ΔIav is then formed. The temporal change of this ratio ΔIn/ΔIav is monitored to see whether the temporal change exceeds a predetermined threshold value SW:

$$\frac{d\left(\frac{\Delta In}{\Delta Iav}\right)}{dt} > SW$$

If this temporal change of the ratio ΔIn/ΔIav exceeds the threshold value SW, then the presence of an inter-turn short-circuit at the respective coil Ln is recognized. The monitoring unit 9 thereupon transmits the monitoring signal 11 with data relating to the coil Ln concerned to the monitoring receiver 12. The monitoring signal 11 transmits data relating to the coil Ln concerned, for example a number or an identifier (ID) of the coil Ln that is affected by the inter-turn short-circuit.

It is particularly advantageous here that the ratio ΔIn/ΔIav is monitored for the occurrence of a temporal change that exceeds the threshold value SW (i.e. for the occurrence of a large temporal change). Through the use of this ratio, the current differences ΔIn are related to the mean value ΔIav of the current differences of all the coils. As a result, even a small current difference in the current In flowing through the coil Ln leads to a significant change in the ratio ΔIn/ΔIav. This change in the ratio ΔIn/ΔIav is in particular large enough that it differs significantly from noise, temperature drift in the coil currents (layer currents), drift in the accuracy of the measuring technology used and/or from interfering signals that are coupled in. A secure and reliable recognition of an inter-turn short-circuit in the coil Ln is thus possible.

A method for monitoring an electrical arrangement, and an electrical arrangement, are given, with which even an inter-turn short-circuit of just a single winding in one of the coils can be securely and reliably recognized. An inter-turn short-circuit is also referred to as a winding short. Short-circuit monitoring for the arrangement can thus be realized, in particular short-circuit monitoring for a choke with at least two coils (at least two layers). The individual coils here can be designed as cylindrical coils, each of which forms a concentric layer of the arrangement.

The method described realizes what is known as a magnification function through the application of a differential measurement. The effect of the absolute value of the coil currents I1, I2 or I3 is thus avoided.

It is particularly advantageous in the method and in the arrangement that even a single inter-turn short-circuit in one of the coils is recognized as soon as it arises, and not only indirectly when the arrangement overheats and signs of fire such as smoke or heat occur.

An individual current sensor that is coupled to the current path of the coil is assigned to each coil. The transformer ratio of the current sensor (for example a current transformer) is adjusted approximately in accordance with the expected current of the respective coil, in order to obtain consistent secondary currents of the current transformer. The secondary windings of the current transformer are connected in series, wherein the series circuit is connected to form a closed mesh. A mean current develops in this mesh that describes the mean current Iav of the coil currents flowing through the coils L1, L2 and L3. Each secondary winding is provided here with an ohmic resistor (measuring resistor) connected in parallel, in order to ascertain the current difference ΔIn for each coil. The value of the resistance of the measuring resistor can also be adjusted to the different coil currents I1, I2 or I3 in such a way that when the arrangement is operating, approximately equal voltages arise at the measuring resistors of the individual current transformers. A uniform assessment (scaling) of the three parallel-connected currents is thus achieved.

The monitoring unit exclusively evaluates the current differences ΔIn. The absolute value of the currents I1, I2 and I3 flowing through the coils, and the absolute value of the mean value Iav, are thereby masked out, as it were. In practical operation, small, lasting deviations between the individual current differences ΔIn usually also occur in normal operation, i.e. when an inter-turn short-circuit is not present.

It can, for example, be the case that the first current difference ΔI1 permanently differs by 4% from the mean value of the deviations ΔIav, i.e. ΔI1/ΔIav=1.04. If a winding short (short-circuit) now arises in the first coil L1, the first current I1 only changes by a very small percentage, for example by 2%. This absolute change would be difficult to ascertain metrologically. However, as a result of this inter-turn short-circuit, the ratio ΔI1/ΔIav changes significantly: the first current difference ΔI1 also changes by about 2%. There is thus a sudden change in the ratio ΔI1/ΔIav from 4% to about 6%; this corresponds to a change of 50% in the value of the output signal. This sudden change of 50% in the ratio ΔI1/ΔIav can be securely and reliably recognized even in a tough industrial environment, so that the occurrence of the inter-turn short-circuit is thereby recognized securely and reliably. The temporal change in the ratio ΔI1/ΔIav thus exceeds the predetermined threshold value SW, so that the occurrence of the inter-turn short-circuit in the coil L1 is thus recognized.

The monitoring unit can in particular comprise the following units: a measuring unit with floating inputs, an evaluation unit with logic as described above, a radio data transmission unit and an energy supply unit. The monitoring unit can also be referred to as a sensor node, in particular as a sensor node with a logic unit. The energy supply unit can in particular comprise a rectifier and a voltage stabilizer.

The signal cables used for transmission of the signals can preferably be implemented as triaxial cables. These signal cables can be laid along an equipotential surface of the arrangement, i.e. for example along a support arrangement for the individual coils. At one or both sides the two screens of the triaxial cable can here be placed at the electrical potential of the support arrangement (i.e. be connected to it) in order to screen electrical and magnetic fields. Since the signal cables are laid in an environment subject to heavy electromagnetic loading (for example in the field of a choke), it can be advantageous to use current signals (differential currents) in place of the said voltage signals (measuring resistor voltages). In this case, the monitoring unit 9 can comprise potentially insulated current inputs.

The invention claimed is:

1. A method for monitoring an electrical configuration having a plurality of coils connected electrically in parallel defining a parallel circuit, which comprises the steps of:
    ascertaining for each of the coils of the parallel circuit a current difference between a current flowing through a coil and a mean value of currents flowing through the coils;
    ascertaining a mean value of current differences of the coils;
    determining a ratio between the current difference and the mean value of the current differences for each of the coils;
    monitoring a temporal change of the ratio; and
    recognizing an occurrence of an inter-turn short-circuit at a respective coil if the temporal change of the ratio exceeds a predetermined threshold value; and
    assigning a monitoring unit to the coils of the parallel circuit to which signals that describe the currents flowing through the coils, or signals that describe the current differences being transmitted and by which the signals are evaluated, whereby the occurrence of the inter-turn short-circuit at a respective coil is recognized.

2. The method according to claim 1, wherein on the recognition of the occurrence of the inter-turn short-circuit in one of the coils by the monitoring unit, a monitoring signal is transmitted to a monitoring receiver.

3. The method according to claim 2, which further comprises transmitting the monitoring signal from the monitoring unit to the monitoring receiver by means of a wireless signal and/or by means of an optical fiber.

4. The method according to claim 2, wherein the monitoring receiver is operated at ground potential.

5. The method according to claim 1, wherein the electrical configuration has a first terminal and a second terminal, wherein, when the electrical configuration is operating, the second terminal has at least temporarily a greater electrical potential than the first terminal, and wherein the monitoring unit is operated at an electrical potential of the second terminal.

6. The method according to claim 1, wherein the electrical configuration has at least two said coils connected electrically in parallel.

7. The method according to claim 1, wherein the electrical configuration is a coil configuration.

8. The method according to claim 1, which further comprises ascertaining the current difference between the current flowing through one of the coils and the mean value of the currents flowing through the coils by means of a current transformer that is connected in series with a respective coil, wherein secondary windings of current transformers are disposed in a series circuit, and the series circuit forms a closed mesh.

9. The method according to claim 8, which further comprises connecting a measuring resistor in parallel with each of the secondary windings, wherein a signal is formed from a voltage occurring at the measuring resistor that describes the current difference of an associated one of the coils.

10. The method according to claim 8, which further comprises supplying the monitoring unit with electrical energy that is coupled out from at least one of the current transformers.

11. The method according to claim 1, which further comprises supplying the monitoring unit with electrical energy that is coupled out from at least one of the currents flowing through the coils.

12. A configuration, comprising:
    a plurality of coils disposed electrically in parallel defining a parallel circuit;
    a measuring device that ascertains for said coils of said parallel circuit a current flowing in each case through said coils, or a current difference between the current flowing through a respective coil of said coils and a mean value of the currents flowing through said coils;
    a monitoring unit assigned to said coils of said parallel circuit that receives signals that describe the currents ascertained or the current differences, said monitoring unit being configured in such a way that said monitoring unit:
    ascertains a mean value of the current differences of said coils;
    forms, for each of said coils, a ratio of the current difference and the mean value of the current differences;
    monitors a temporal change of the ratio; and
    recognizes an occurrence of an inter-turn short-circuit in the respective coil if the temporal change of the ratio exceeds a predetermined threshold value; and
    a monitoring receiver, wherein upon a recognition of the occurrence of the inter-turn short-circuit in one of said coils, said monitoring unit transmits a monitoring signal to said monitoring receiver.

13. The configuration according to claim 12, wherein said monitoring unit transmits the monitoring signal to said monitoring receiver by means of a wireless signal and/or by means of an optical fiber.

14. The configuration according to claim 12, further comprising:
a first terminal; and
a second terminal, wherein, when the configuration is operating, said second terminal has at least temporarily a greater electrical potential than said first terminal, and said monitoring unit is subject to an electrical potential of said second terminal.

15. The configuration according to claim 12, wherein said monitoring receiver is connected to a ground potential.

16. The configuration according to claim 12, wherein said coils are at least two coils disposed electrically in parallel.

17. The configuration according to claim 12, wherein the configuration is a coil configuration.

18. The configuration according to claim 12 wherein said measuring device is one of a plurality of measuring devices with one of said measuring devices for each of said coils, said measuring devices each containing a current transformer that is connected in series with a respective coil of said coils, wherein each said current transformer having a secondary winding disposed in series with said secondary winding of other ones of said transformers, and said series circuit forms a closed mesh.

19. The configuration according to claim 18, further comprising measuring resistors, one of said measuring resistors is connected in parallel with each said secondary winding, wherein a voltage occurring at said one measuring resistor represents a signal that describes the current difference of an associated one of said coils.

20. The configuration according to claim 18, further comprising an energy supply device that couples electrical energy out of at least one said current transformer and supplies the electrical energy to said monitoring unit.

21. The configuration according to claim 12, further comprising an energy supply device that couples electrical energy out of at least one of the currents flowing through said coils and supplies the electrical energy to said monitoring unit.

\* \* \* \* \*